(12) United States Patent
Martin et al.

(10) Patent No.: US 6,781,180 B1
(45) Date of Patent: Aug. 24, 2004

(54) TRENCH CAPACITOR AND METHOD FOR FABRICATING THE SAME

(75) Inventors: Schrems Martin, Eggersdorf B. Graz (AT); Dirk Drescher, Langebrück (DE); Helmut Wurzer, Dresden (DE); Wolfram Karcher, Weissig (DE)

(73) Assignee: Infineon Technologies AG, Munich (DE)

( * ) Notice: Subject to any disclaimer, the term of this patent is extended or adjusted under 35 U.S.C. 154(b) by 49 days.

(21) Appl. No.: 09/677,545

(22) Filed: Oct. 2, 2000

(30) Foreign Application Priority Data

Sep. 30, 1999 (DE) .......................................... 199 47 053

(51) Int. Cl.[7] .................. H01L 27/108; H01L 29/76; H01L 29/94; H01L 31/119
(52) U.S. Cl. ........................................ 257/301; 257/302
(58) Field of Search ................................. 257/295–310; 438/243–254, 396–398

(56) References Cited

U.S. PATENT DOCUMENTS

| | | | |
|---|---|---|---|
| 4,937,205 A | | 6/1990 | Nakayama et al. |
| 4,949,138 A | * | 8/1990 | Nishimura .................. 257/296 |
| 5,189,503 A | | 2/1993 | Suguro et al. |
| 5,250,829 A | | 10/1993 | Bronner et al. |
| 5,344,381 A | | 9/1994 | Cabrera y Lopez Caram |
| 5,905,279 A | * | 5/1999 | Nitayama et al. ............ 257/301 |
| 5,937,296 A | * | 8/1999 | Arnold ........................ 438/243 |
| 6,180,480 B1 | * | 1/2001 | Economikos et al. ....... 438/386 |
| 6,277,681 B1 | * | 8/2001 | Wallace et al. ............. 438/198 |

OTHER PUBLICATIONS

Frank S. Becker et al.: "Low Pressure Deposition of Doped $SiO_2$ by Pyrolysis of Tetraethylorthosilicate (TEOS)", Journal of the Electrochemical Society, vol. 136, No. 10, Oct. 1989, pp. 3033–3043.

C.N.Ransom et al.:"Shallow $n^+$ Junctions in Silicon by Arsenic Gas–Phase Doping", Journal of the Electrochemical Society, vol. 141, No. 5, May 1994, pp. 1378–1381.

* cited by examiner

Primary Examiner—Cuong Nguyen
(74) Attorney, Agent, or Firm—Laurence A. Greenberg; Werner H. Stemer; Ralph E. Locher

(57) ABSTRACT

A trench capacitor for use in a semiconductor memory cell is formed in a substrate and includes a trench having an upper region and a lower region. An insulation collar is formed in the upper region of the trench. The lower region of the trench extends through a buried well. A dielectric layer, which is formed from tungsten oxide, serves as a capacitor dielectric. A conductive trench filling, which is filled into the trench, is formed from silicon or a tungsten-containing material such as tungsten, tungsten silicide or tungsten nitride.

21 Claims, 10 Drawing Sheets

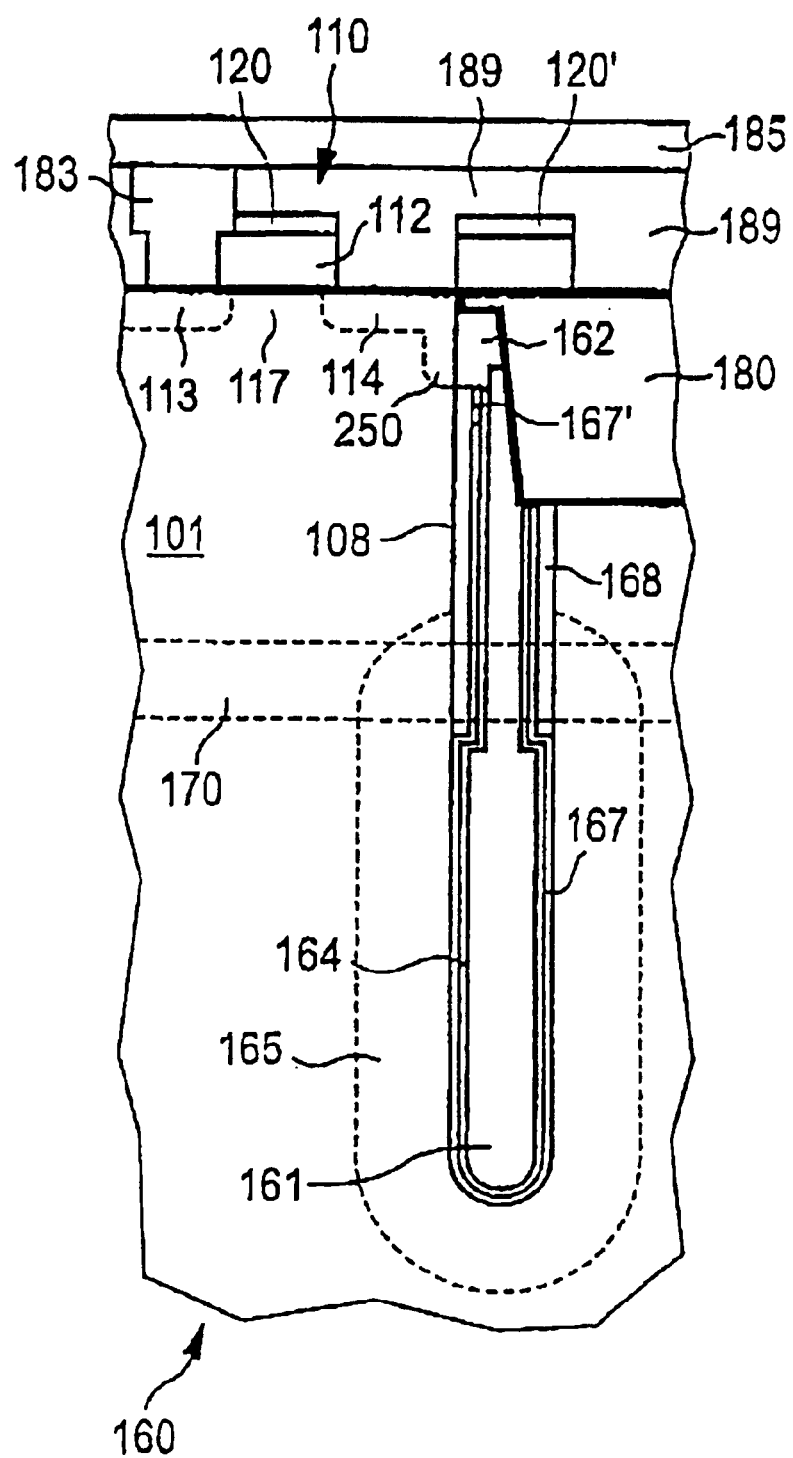

TRENCH CAPACITOR AND METHOD FOR FABRICATING THE SAME

BACKGROUND OF THE INVENTION

Field of the Invention

The invention relates to a trench capacitor for storing an electrical charge and to a method for fabricating such a trench capacitor.

Integrated circuits (ICs) or chips contain capacitors for the purpose of storing electrical charges, such as, for example, in a dynamic random access memory (DRAM). The charge state in the capacitor represents a data bit in this case.

In order to maintain or increase international competitiveness, it is necessary to continually reduce the costs that have to be expended to realize a specific electronic function, and thus to continuously increase productivity. The continuous increase in productivity is achieved by a progressive miniaturization. This necessitates realizing an ever greater number of functions on the same chip area. This is accompanied by a continuous reduction in the size of the individual functions on the chip, so that the dimensions of the capacitors used for charge storage are also reduced.

However, the progressive miniaturization of the capacitors entails a decrease in the capacitance of the capacitors. A series of applications, such as DRAM memories for example, require a minimum storage capacitance of the storage capacitors. Therefore, it is necessary to maintain or even to increase the storage capacitance of the storage capacitors despite reduced structural dimensions. If, as is generally customary nowadays, silicon oxide is used as a capacitor dielectric, then the layer thickness of the storage dielectric would have to be reduced to a few atomic layers in future technologies. However, it is very difficult to fabricate such thin silicon oxide layers reproducibly and with sufficient accuracy, because fluctuation in the layer thickness by one atomic layer means fluctuation by more than 10%. Furthermore, it is very difficult to adequately suppress the leakage currents between two capacitor electrodes which are isolated by a storage dielectric having a thickness of a few atomic layers, since, through the effect of quantum mechanical tunneling, the charge carriers can tunnel through the potential barrier produced by the thin storage dielectric.

The prior art has already disclosed capacitors in which the storage capacitance is increased using materials such as tantalum oxide ($TaO_2$) having a dielectric constant $\epsilon_r=20$, and also barium strontium titanate (BST, (Ba, Sr) $TiO_3$) having an $\epsilon_r$ of up to 1000 or lead zirconate titanate (PZT, Pb (Zr, Ti) $O_3$). However, complicated and costly deposition methods are necessary for the use of BST, PZT or SBT layers, and barrier layers made of platinum (Pt), ruthenium (Ru) or ruthenium oxide ($RuO_2$) that are difficult to process are also necessary.

The increase in the dielectric constant $\epsilon_r$ through the use of $TaO_2$ ($\epsilon_r=20$) is relatively small in comparison with NO or ONO layers, which already have a dielectric constant of $\epsilon_r=6$ to 8. Although the dielectric constant is significantly above that when BST, PZT or SBT is used, the capacitance of the capacitors is nonetheless limited by the required barrier layers with respect to silicon and polysilicon layers which serve as electrodes.

In the case of BST, PZT and SBT, it has been found that these materials belong to the materials which, chemically, cannot be etched or can be etched only with difficulty, in the case of which the etching removal, even given the use of reactive gases, is based predominantly or almost exclusively on the physical component of the etching. Due to the small or absent chemical component of the etching, the etching removal of the layer to be patterned is of the same order of magnitude as the etching removal of the mask or of the support (etching stop). Therefore, the etching selectivity with respect to the etching mask or with respect to the support is generally small, the consequence of which is that, due to the erosion of masks with inclined sidewalls and the unavoidable faceting (beveling, tapering) on the masks, only low dimensional accuracy of the patterning can be ensured. The faceting thus limits the smallest feature sizes that can be attained in the course of patterning, and also the attainable steepness of the profile sidewalls in the layers to be patterned.

Due to a lack of thermal stability, BST layers cannot, moreover, be used for processes which provide high-temperature steps after the formation of the BST layer, as is the case for example in the fabrication of DRAM memories with deep trench capacitors.

SUMMARY OF THE INVENTION

It is accordingly an object of the invention to provide a trench capacitor which overcomes the above-mentioned disadvantages of the heretofore-known trench capacitors of this general type and which provides a high storage capacitance in relation to its geometrical dimensions and has sufficient thermal stability for process steps which are carried out after its formation. It is a further object of the invention to provide a method of producing such a trench capacitor.

With the foregoing and other objects in view there is provided, in accordance with the invention, a trench capacitor, including:

a substrate formed with a trench;

the trench having an upper region and a lower region;

an insulation collar formed in the upper region;

a buried well formed in the substrate, the lower region at least partly extending through the buried well;

a dielectric layer of tungsten oxide for lining the lower region, the dielectric layer serving as a capacitor dielectric; and a conductive trench filling disposed in the trench.

The idea underlying the invention is the use of tungsten oxide (WOx) as a capacitor dielectric. Since tungsten oxide has dielectric constants $\epsilon_r$ of greater than 50 and even greater than 300, the capacitance of the trench capacitor is increased, whilst maintaining the geometrical dimensions, by approximately 2 orders of magnitude (factor 100) if tungsten oxide is used instead of silicon oxide. The trench capacitor according to the invention has the advantage, moreover, that the installations used in semiconductor technology can likewise be used for producing tungsten oxide layers. Specially adapted and thus expensive installations, as are required for fabricating BST, PZT or SBT layers, do not have to be used. The tungsten used for producing tungsten oxide layers diffuses only very slightly into silicon, resulting in a reduced risk of contamination in the case of the trench capacitor according to the invention. The use of tungsten oxide as a capacitor dielectric is not restricted to silicon technology, however, but rather may also be used in connection with other semiconductors such as, for example, gallium arsenide (GaAs). Tungsten oxide can be used as a capacitor dielectric outside the scope of semiconductor technology as well, such as, for example, in discrete components for low-voltage and high-voltage technology. Furthermore, tungsten oxide has markedly good thermal stability up to temperatures in excess of 1100° C. As a result, tungsten oxide can be used as a storage dielectric in memory cells having a trench capacitor, in which a transistor is formed after the trench capacitor has been fabricated, because the processing of a transistor requires, for example, thermal steps for annealing source and drain regions which are above 1000° C.

Progressive miniaturization additionally has the consequence that the sheet resistance of capacitor electrodes continuously increases, due to the decreasing layer thickness. Therefore, in an advantageous embodiment, at least one of the capacitor electrodes is composed of tungsten or a tungsten-containing material. As a result, the resistance of the capacitor electrodes is reduced and the time needed for charging and discharging the trench capacitor is advantageously shortened.

In accordance with another feature of the invention, the conductive trench filling is a tungsten-containing material.

In a further advantageous embodiment of the invention, the tungsten-containing material is composed of tungsten silicide, tungsten nitride or of pure tungsten.

In a further advantageous embodiment of the invention, the dielectric layer forming the capacitor dielectric has a dielectric constant $\epsilon_r > 50$.

In accordance with another feature of the invention, a barrier layer is disposed between the dielectric layer and the substrate and/or between the dielectric layer and the conductive trench filling.

In a further advantageous embodiment of the invention, a barrier layer made of silicon oxide, silicon nitride, oxynitride, tungsten nitride, titanium nitride or tantalum nitride is formed, which is situated between the tungsten oxide layer, which forms the capacitor dielectric, and the buried plate of the capacitor, which is composed of doped silicon.

In a further advantageous embodiment of the invention, a vertical transistor is additionally situated in the trench, and serves as a selection transistor for the memory cell.

With the objects of the invention in view there is also provided, a method of producing a trench capacitor, the method includes the steps of:

introducing a buried well into a substrate;

forming a trench in the substrate, the trench having an upper region and a lower region;

forming an insulation collar in the upper region;

providing a capacitor dielectric by forming a dielectric layer of tungsten oxide lining the lower region; and filling the trench with a conductive trench filling for providing an inner capacitor electrode.

In an advantageous fabrication method, the dielectric layer is formed by the deposition of a tungsten-containing layer, which is subsequently thermally oxidized in an oxygen-containing atmosphere.

In accordance with another mode of the invention, the tungsten-containing layer is formed from tungsten nitride, tungsten silicide or pure tungsten.

In a further advantageous embodiment of the method according to the invention, the oxidation of the tungsten-containing layer is carried out at a temperature from 200° C. to 600° C. in an oxygen-containing atmosphere, a water-containing atmosphere, an $N_2O$-containing atmosphere and/or an NO is containing atmosphere.

A further advantageous fabrication method forms the dielectric layer by reactive sputtering of tungsten in an oxygen-containing atmosphere. In this case, tungsten is converted into tungsten oxide before the dielectric layer is formed.

A further advantageous embodiment of the fabrication method according to the invention carries out a thermal treatment of the dielectric layer at temperatures of between 550 and 1100° C., with the result that the dielectric layer composed of tungsten oxide develops a dielectric constant $\epsilon_r > 50$.

In a further advantageous fabrication method, the tungsten-containing material of which the conductive trench filling is composed or from which a tungsten-containing layer is formed is fabricated by a CVD (Chemical Vapor Deposition) method. Furthermore, the CVD method may involve a selective CVD deposition in which tungsten is deposited selectively with respect to silicon oxide and silicon nitride on silicon. The selective CVD deposition may be carried out for example using tungsten hexafluoride ($WF_6$) as a starting material at temperatures from 200 to 600° C.

Other features which are considered as characteristic for the invention are set forth in the appended claims.

Although the invention is illustrated and described herein as embodied in a trench capacitor for charge storage and a method for fabricating it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3b is a diagrammatic, partial sectional view of a further exemplary embodiment of a trench capacitor according to the invention, corresponding to a further embodiment of the method according to the invention;

FIG. 8 is a diagrammatic, partial sectional view of a further embodiment of a trench capacitor configuration for the fabrication of a trench capacitor according to the invention as shown in FIG. 3a; and FIG. 9 is a diagrammatic, partial sectional view of a further embodiment of a trench capacitor configuration for the fabrication of a trench capacitor according to the invention as shown in FIG. 3a.

DESCRIPTION OF THE PREFERRED EMBODIMENTS

Figure 1:
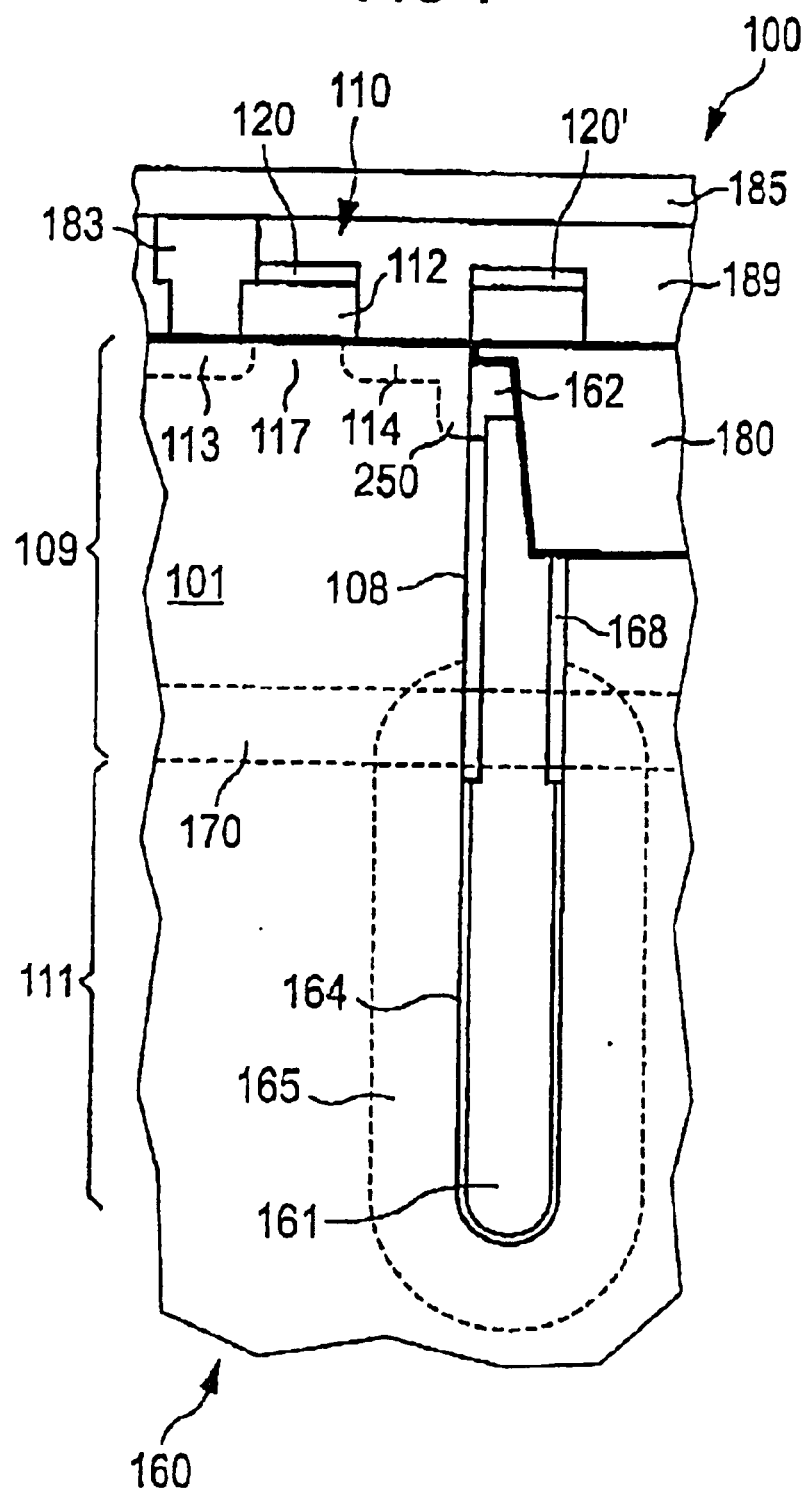
FIG. 1 is a diagrammatic, partial sectional view of an exemplary embodiment of a trench capacitor according to the invention, corresponding to a first embodiment of the method according to the invention.

In the figures, identical reference symbols designate identical or functionally identical elements. Referring now to the figures of the drawings in detail and first, particularly, to FIG. 1 thereof, there is shown a first embodiment of the invention. The memory cell 100 illustrated includes a trench capacitor 160 and a transistor 110. The trench capacitor 160 is formed in a substrate 101. A buried well 170, which is composed of a dopant material for example, is introduced in the substrate 101. The trench capacitor 160 has a trench 108 having an upper region 109 and a lower region is 111. An insulation collar 168 is situated in the upper region 109 of the trench 108. The lower region of the trench penetrates at least partially through the buried well 170. Provided around the lower region 111 of the trench 108 is a buried plate 165, which forms the outer capacitor electrode. The buried plates 165 of the adjacent memory cells are electrically connected to one another by the buried well 170.

The lower region 111 of the trench 10B is lined with a dielectric layer 164, which forms the storage dielectric of the trench capacitor 160. According to the invention, the dielectric layer 164 is composed of tungsten oxide.

The trench 108 is filled with a conductive trench filling 161, which forms the inner capacitor electrode of the trench capacitor 164.

The transistor 110 includes a source region 114 and a drain region 113, which is connected to an edgeless contact 183. Furthermore, the transistor 110 includes a channel 117 controlled by a gate 112. The gate 112 is connected to a word line 120. The edgeless contact 183 is connected to a bit line 185 running above a dielectric layer 189.

Situated above the conductive trench filling 161 is a conductive buried bridge or strap 162, which is connected to the source region 114 of the transistor 110 with the aid of a buried contact 250.

In this variant, a passing word line 120' runs above a trench insulation 180, the word line being insulated from the trench filling 161 by the trench insulation 180.

Figure 2:
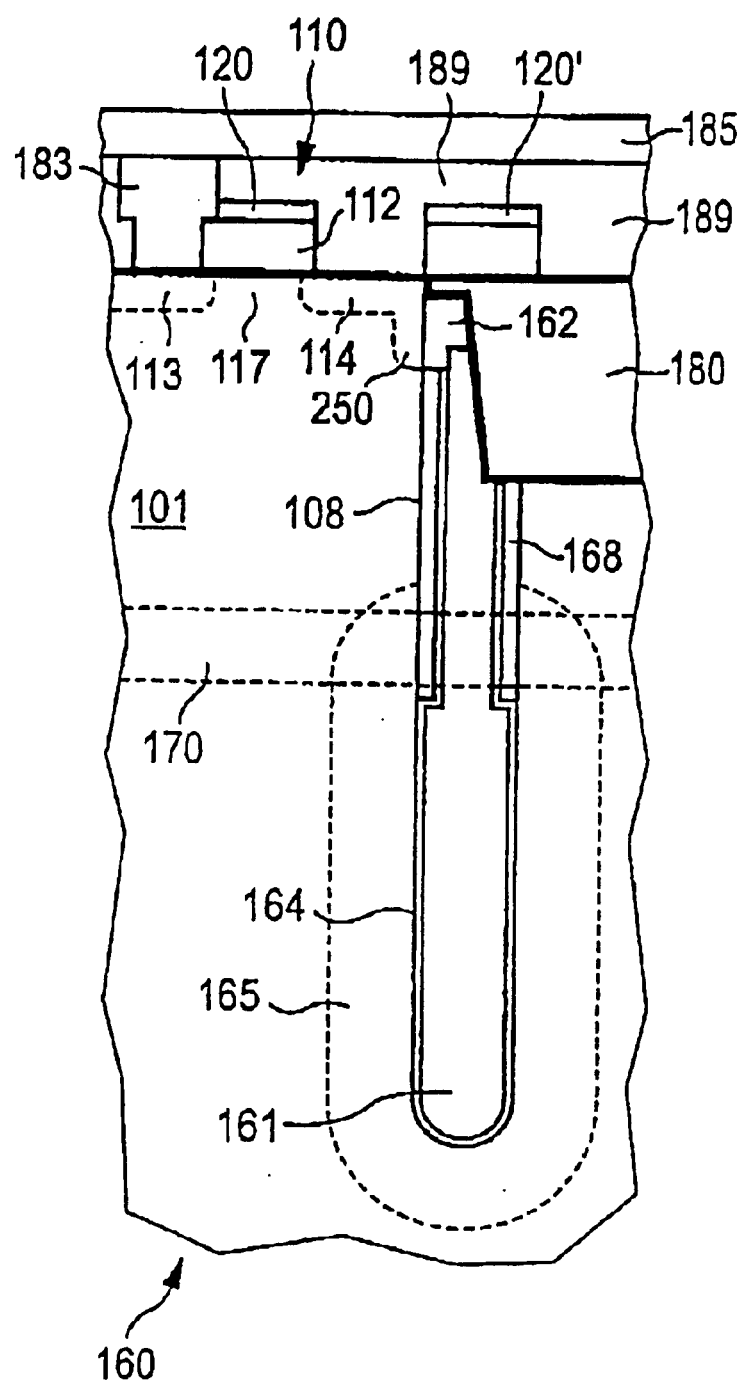
FIG. 2 is a diagrammatic, partial sectional view of a further exemplary embodiment of a trench capacitor according to the invention, corresponding to a second embodiment of the method according to the invention.

FIG. 2 shows a further embodiment of the trench capacitor 160 according to the invention, which differs from the variant illustrated in FIG. 1 by the fact that the dielectric layer 164 is not limited to the lower region 111 of the trench 108, rather the dielectric layer 164 is additionally situated in the upper region 109 of the trench 108 on the insulation collar 168.

Figure 3A:
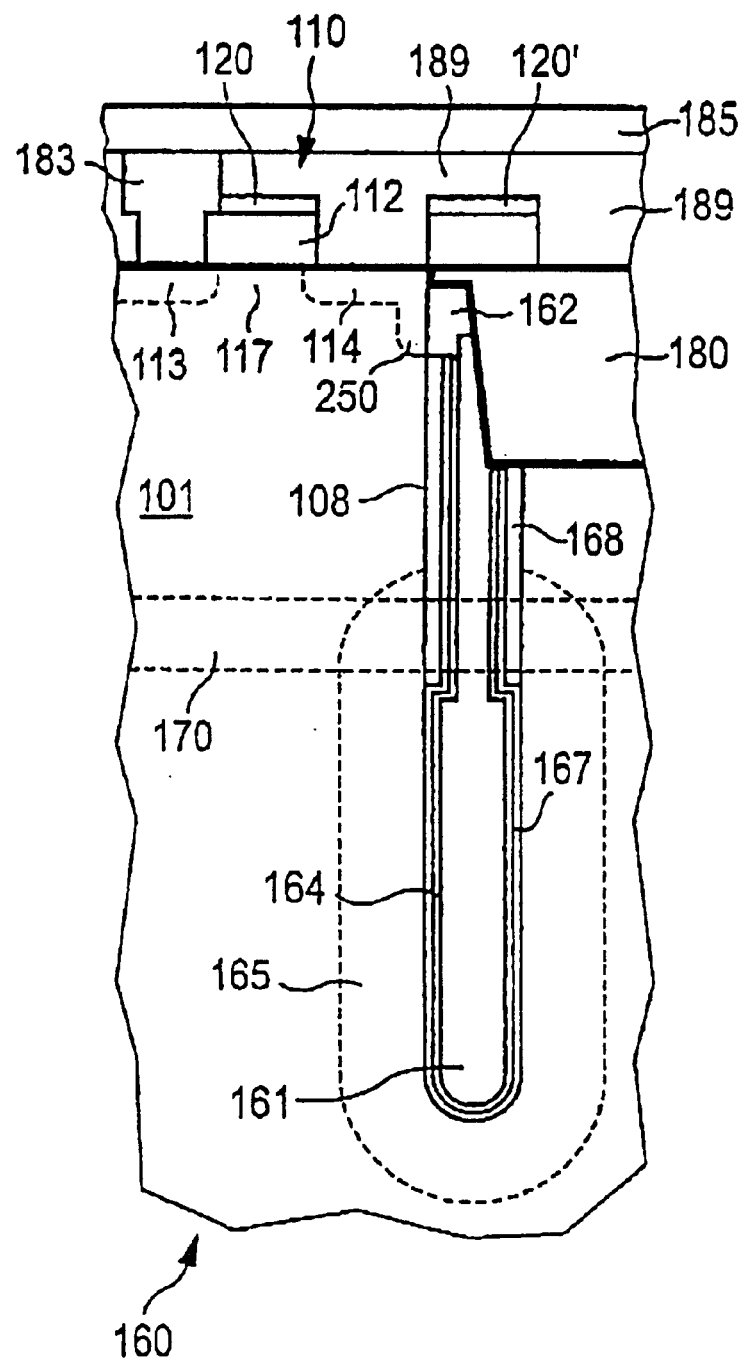
FIG. 3a is a diagrammatic, partial sectional view of a further exemplary embodiment of a trench capacitor according to the invention, corresponding to a further embodiment of the method according to the invention.

FIG. 3a illustrates a further embodiment of the trench capacitor according to the invention. The variant of the trench capacitor 160 that is illustrated in FIG. 3a differs from the variant illustrated in FIG. 2 by virtue of an additional barrier layer 167, which is situated in the trench 108 between the dielectric layer 164 and the buried plate 165 and between the dielectric layer 164 and the insulation collar 168, respectively.

FIG. 3b illustrates a variant of the trench capacitor 160 shown in FIG. 3a. FIG. 3b differs from FIG. 3a by virtue of an oxide region 167', which is provided in case a conductive barrier layer 167 is used. The oxide region 167' has the purpose of providing insulation between the conductive trench filling 161. and the barrier layer 167 and is disposed between the insulation collar 168, the dielectric layer 164, the barrier layer 167 and the conductive buried bridge 162.

Figure 4:
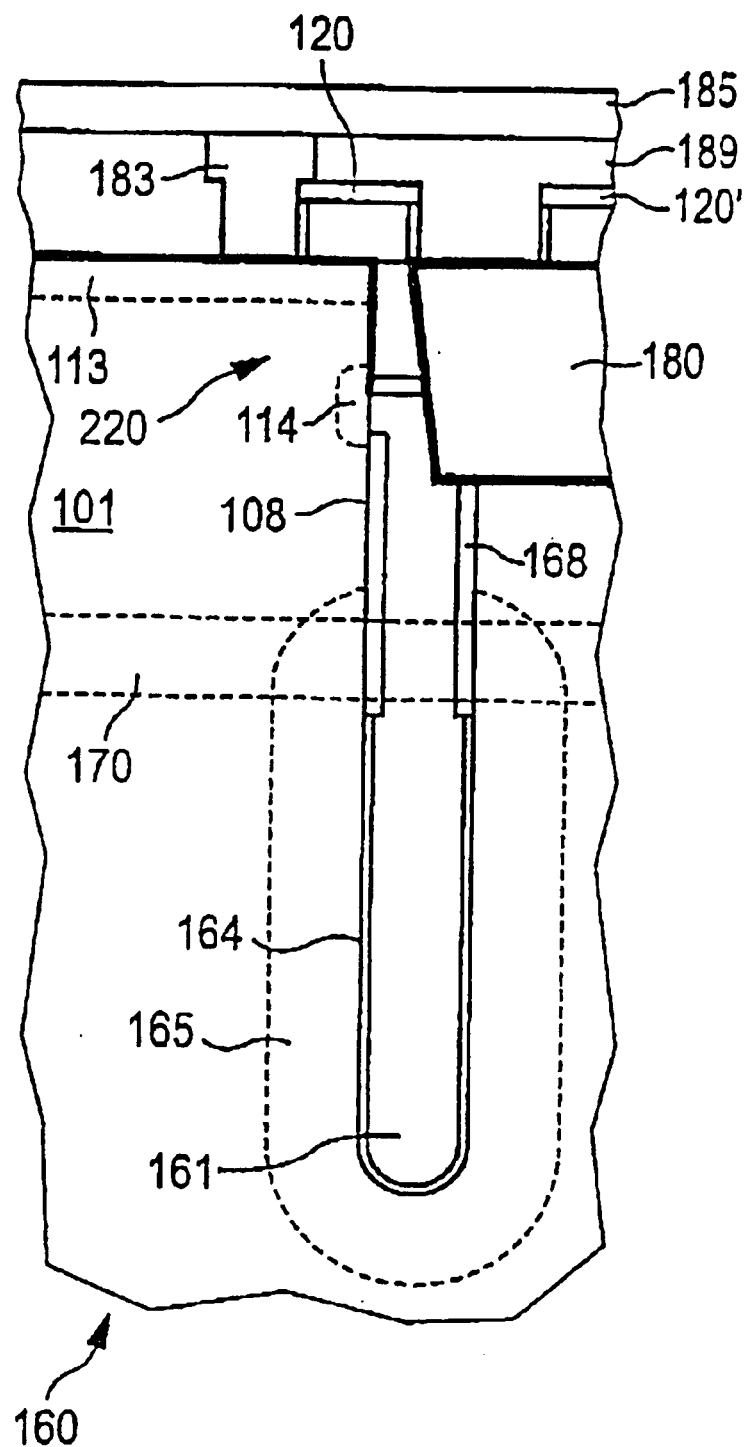
FIG. 4 is a diagrammatic, partial sectional view of a further exemplary embodiment of a trench capacitor according to the invention, corresponding to a further embodiment of the method according to the invention.

FIG. 4 shows a further variant of the trench capacitor 160 according to the invention, which differs from the variant shown in FIG. 1 by the fact that a vertical transistor 220 is provided in the trench 108 above the insulation collar 168.

Figure 5:
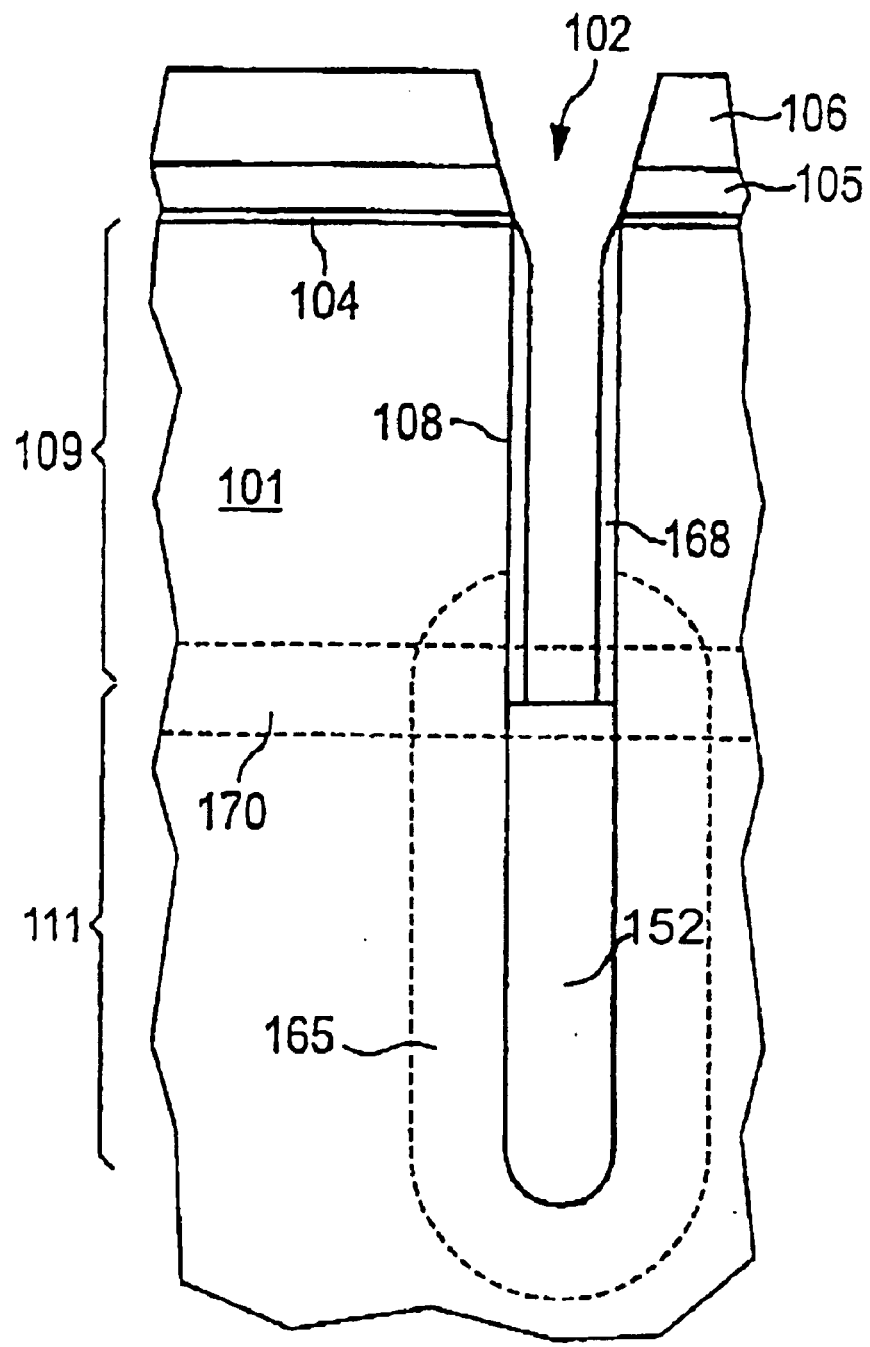
FIG. 5 is a diagrammatic, partial sectional view of a trench capacitor configuration illustrating an embodiment of the method for fabricating a trench capacitor according to one of FIGS. 1 to 4.

With reference to FIG. 5, a substrate 101 is provided for the fabrication of the trench capacitor 160 according to the invention. In the present variant, the substrate 101 is composed of silicon and is lightly doped with p-type dopants, such as boron for example. An n-doped buried well 170 is formed at a suitable depth in the substrate 101. Phosphorous or arsenic can be used as the dopant for doping the buried well 170. The buried well 170 may be produced by implantation for example. It serves for insulating the p-type well from the substrate 101 and additionally forms a conductive connection between the buried plates 165 of the adjacent trench capacitors. As an alternative, the buried well 170 may be formed by epitaxially grown, doped silicon layers, or by a combination of crystal growth (epitaxy) and implantation. This technique is described in U.S. Pat. No. 5,250,829 to Bronner et al.

A layer stack is formed on the surface of the substrate 101 and includes, by way of example, a substructure oxide layer 104 and a substructure stop layer 105, which can be used as polish or etching stop and is composed of nitride for example. A hard mask layer 106 may optionally be provided above the substructure stop layer 105. The hard mask layer may be composed of tetraethyl orthosilicate (TEOS) or other materials such as, for example, borosilicate glass (BSG). In addition, an antireflection coating (ARC) can be used in order to improve the lithographic resolution.

The hard mask layer 106 is patterned using customary photolithographic techniques, in order to define a region 102 in which the trench 108 is to be formed. The hard mask layer 106 is subsequently used as an etching mask for a reactive ion etching step which forms the deep trench 108.

A natural oxide layer is formed in the trench 108, and serves as an etching stop in subsequent etching steps. The trench is subsequently filled with an insulation collar sacrificial layer 152, which ensures sufficient thermal stability up to 1100° C. and can be removed selectively with respect to nitride and/or oxide, such as, for example, polysilicon, amorphous silicon or other suitable materials. In this process variant, the insulation collar sacrificial layer 152 is composed of polysilicon. The polysilicon sacrificial layer is sunk in the trench 108 down to the underside of the insulation collar 168 to be formed. The removal of the sacrificial layer may be carried out, by way of example, by planarization through the use of chemical mechanical polishing (CMP) or chemical dry etching (CDE) or selective ion etching. The insulation collar sacrificial layer 152 is then sunk in the trench 108 by selective ion etching. The use of chemical dry etching to sink the insulation collar sacrificial layer in the trench 108 is likewise possible.

A dielectric layer is subsequently deposited on the wafer, and covers the layer stack and the sidewalls of the trench 108 in its upper region 109. The dielectric layer is used to form the insulation collar 168 and is composed of oxide for example. The dielectric layer is subsequently etched, for example by reactive ion etching (RIE) or through the use of CDE, in order to form the insulation collar 168. The chemical agents for the reactive ion etching are chosen in such a way that the oxide of the insulation collar 168 is etched selectively with respect to the polysilicon of the insulation collar sacrificial layer 152 and the nitride of the hard mask layer 106.

The insulation collar sacrificial layer 152 is subsequently removed from the lower region of the trench 108. This is preferably achieved by CDE etching, the thin natural oxide layer serving as a CDE etching stop. As an alternative, wet etching, for example using KOH or HF-NHO$_3$ and CH$_3$OOH mixture, can likewise be used during the removal of the insulation collar sacrificial layer 152. After the removal of the insulation collar sacrificial layer 152, the thin natural oxide layer is removed through the use of etching vapor and a buried plate 165 with n-type dopant, such as arsenic or phosphorus for example, is formed as the outer capacitor electrode. In this case, the insulation collar 168 serves as a doping mask which limits the doping to the lower region 111 of the trench 108. In order to form the buried plate 165, it is possible to use vapor phase doping, plasma doping or plasma immersion ion implantation (PII). These techniques are described for example in Ransom et al., J. Electrochemical. SOC., Vol. 141, No. 5 (1994), p. 1378 ff.; U.S. Pat. No. 5,344,381 and U.S. Pat. No. 4,937,205. Ion implantation using the insulation collar 168 as a doping mask is likewise possible. As an alternative, the buried plate 165 can be formed using a doped silicate glass, such as ASG for example, as dopant source. This variant is described for example in Becker et al., J. Electrochemical. SOC., Vol. 136 (1989), p. 3033 ff. If doped silicate glass is used for the doping, then it is removed after the formation of the buried plate 165.

Figure 6:
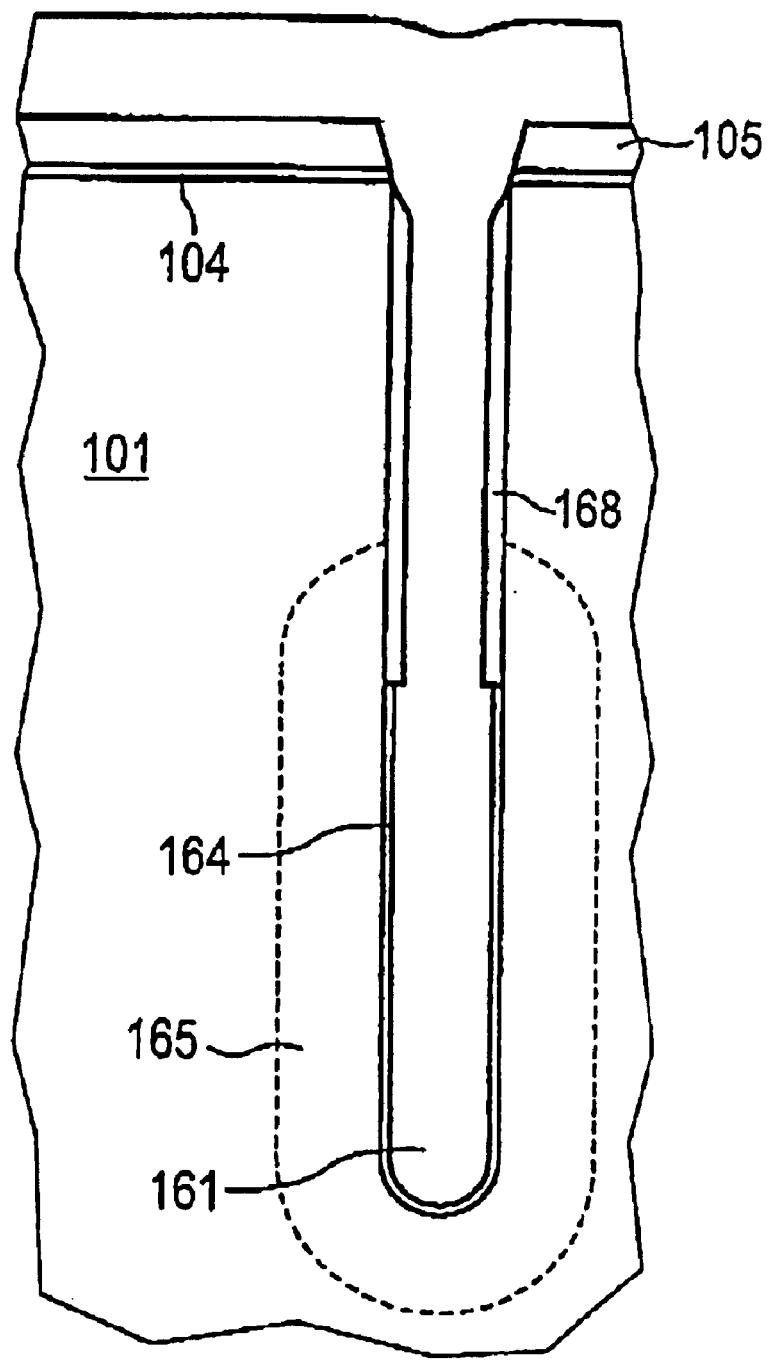
FIG. 6 is a diagrammatic, partial sectional view of a further embodiment of a trench-capacitor configuration for the fabrication of a trench capacitor according to the invention as shown in FIGS. 1 or 4.

With reference to FIG. 6, a dielectric layer 164 composed of tungsten oxide is formed. In order to form the tungsten oxide layer, a tungsten layer, for example, may be deposited which is subsequently oxidized. In order to deposit the tungsten layer, selective tungsten deposition, for example, is used, which forms a tungsten seed layer in the lower region 111 of the trench 108 on the uncovered silicon areas. The tungsten seed layer may be formed using a CVD process, for example, which grows WF$_6$+SiH$_4$ at 500 Pa and 470° C. The tungsten seed layer forms selectively on the uncovered silicon surfaces. In a second step, the tungsten bulk layer is grown, which is formed using a CVD process with the starting substances WF$_6$+H$_2$ at 104 Pa and 470° C. In this case, the tungsten bulk layer is formed selectively on the tungsten seed layer. During a subsequent oxidation process, the tungsten layer that has been formed is oxidized and a tungsten oxide layer is produced, which constitutes the dielectric layer 164.

In the subsequent process step, the conductive trench filling 161 is formed. To that end, using a CVD method for example, a doped, amorphous silicon is deposited into the trench 108 and onto the substrate surface. The conductive trench filling 161 may also be formed from tungsten, tungsten nitride or tungsten silicide. If the conductive trench filling 161 is formed from tungsten, then it is possible to use a CVD process with the starting substances WF$_6$+H$_2$ at $10^4$ Pa and 470° C. In order to fabricate the conductive trench filling 161 from tungsten nitride, it is possible, for example, to produce a tungsten layer by the method mentioned above. The layer is then thermally nitrided. In this case, it is also possible to effect the alternately stepwise deposition of thin tungsten layers and nitriding of these thin tungsten layers until the entire conductive trench filling 161 has been formed from tungsten nitride. As an alternative, tungsten nitride can be formed using a CVD tungsten nitride method which, from 4 WF$_6$ +N$_2$ +12H$_2$, forms the desired 4 W$_2$N+ 24 (HF) at 350 to 400° C. If the conductive trench filling 161 is formed from tungsten silicide, then it is possible to use a CVD method with the starting substances WF$_6$ +SiH$_2$Cl$_2$.

Figure 7:
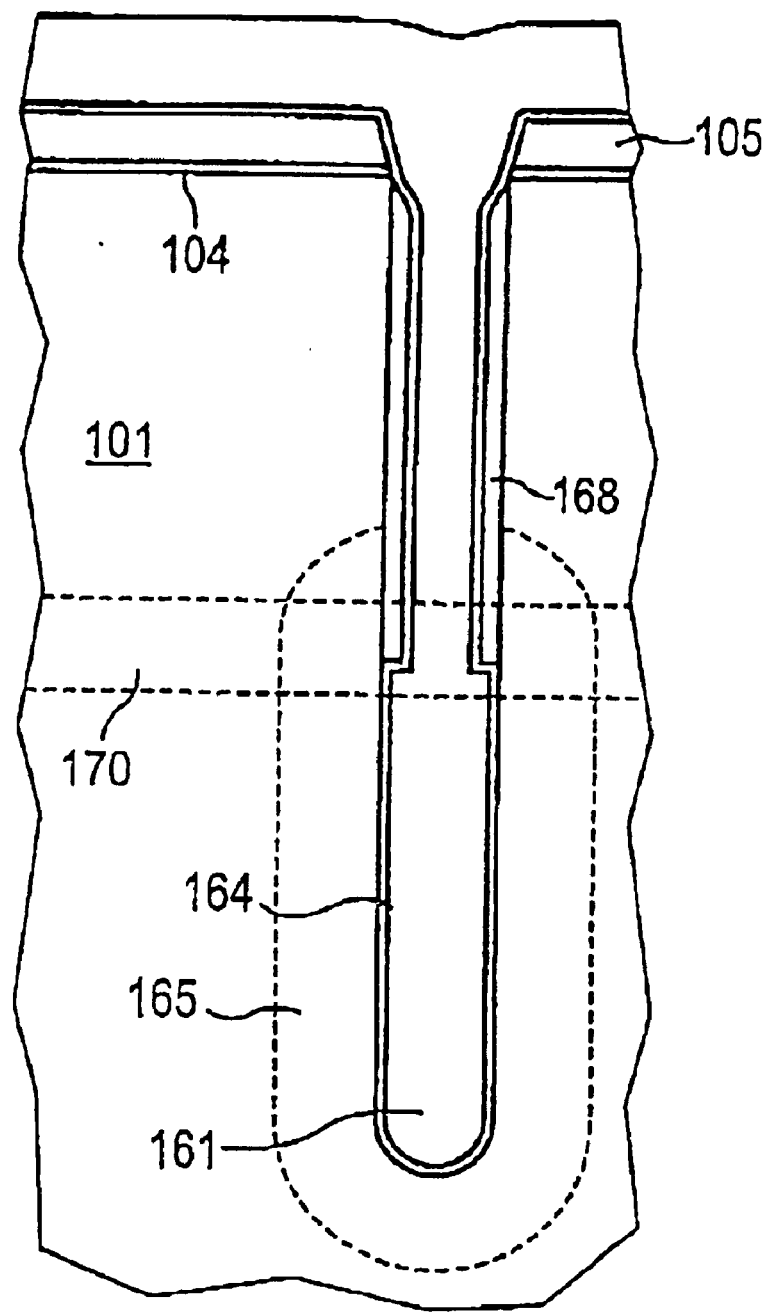
FIG. 7 is a diagrammatic, partial sectional view of a further embodiment of a trench capacitor configuration for the fabrication of a trench capacitor according to the invention as shown in FIG. 2.

The method for fabricating a trench capacitor in accordance with FIG. 3a is described with reference to FIG. 7. The process steps as were explained in connection with FIG. 5 are carried out for this purpose. Following the process stage shown in FIG. 5, the dielectric layer 164 is formed from tungsten oxide. In contrast to the fabrication method shown in FIG. 6, in FIG. 7 the dielectric layer is formed not only in the lower region 111 of the trench 108 but also in the upper region 109 of the trench 108, in which the insulation collar 168 is situated. In order to form the tungsten oxide layer, a tungsten layer, for example, may be deposited which is subsequently oxidized. In order to form the tungsten layer, selective tungsten deposition is not used in this case but rather, by way of example, a CVD tungsten deposition process which uses the starting substances WF$_6$ +H$_2$ at 470° C. and $10^4$ Pa in order to form a tungsten layer. During a subsequent oxidation process, the tungsten layer that has been formed is oxidized and a tungsten oxide layer is produced, which forms the dielectric layer 164.

The conductive trench filling 161 is formed in the subsequent process step, as has already been described in connection with FIG. 6.

Figure 8:
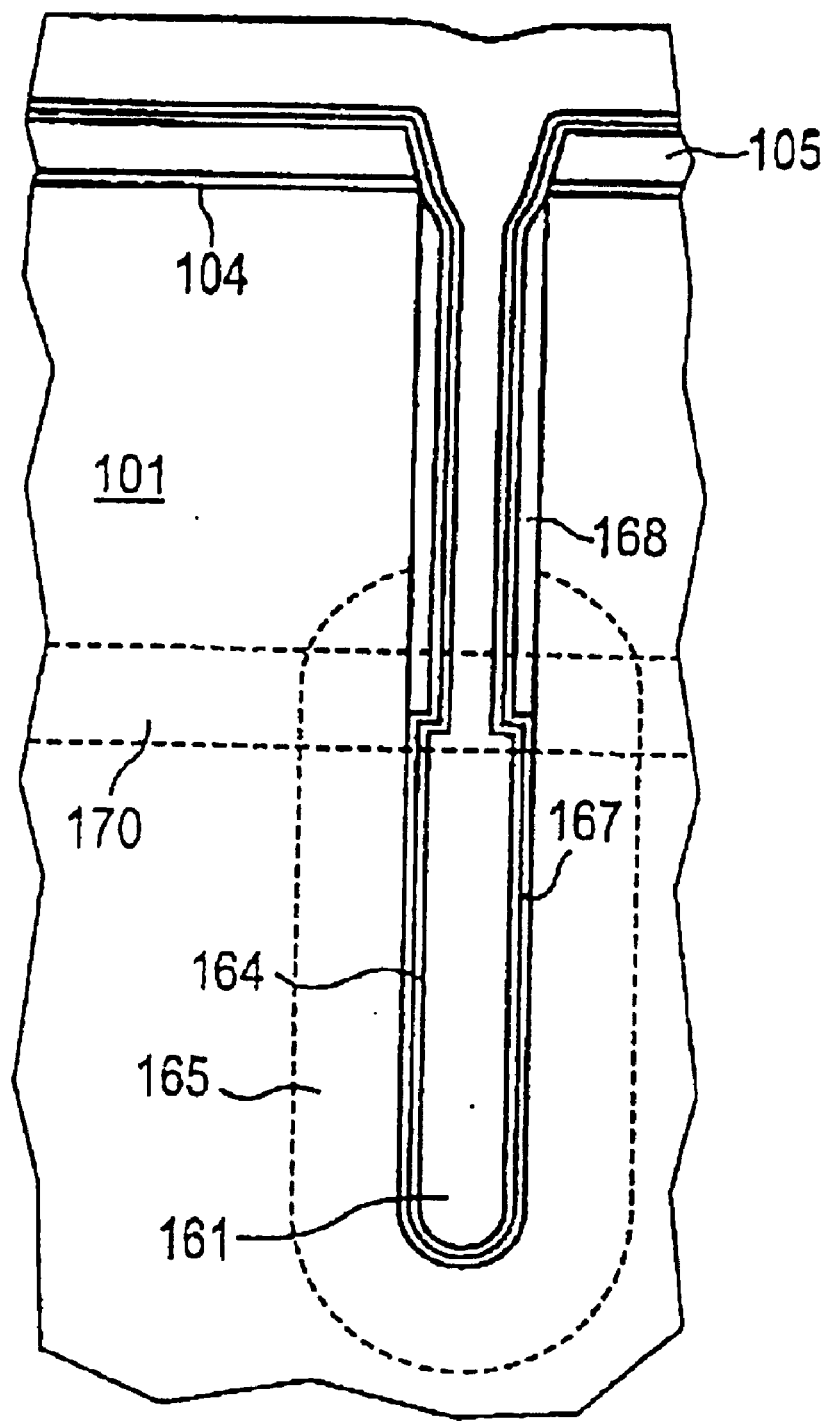

FIG. 8 illustrates a method for fabricating a trench capacitor in accordance with FIG. 3a. Following the process stage from FIG. 5, firstly a barrier layer 167 is formed in the trench 108. The barrier layer 167 is composed of tungsten nitride for example. In order to form the barrier layer 167 from tungsten nitride, a tungsten layer, for example, may be deposited in the trench 108. The layer is then nitrided. The above-mentioned CVD tungsten deposition processes are suitable for depositing a tungsten layer. The deposited tungsten layer is nitrided in a further process step under a nitrogen atmosphere. A further method for producing a tungsten nitride layer is the direct CVD deposition of a tungsten nitride layer. To that end, it is possible to use, for example, a CVD method with the starting materials 4 WF$_6$ +N$_2$ +12H$_2$ at a temperature of from 350 to 400° C. The layer thickness of the tungsten nitride layer thus produced can be produced in a range of from a few nanometers to several micrometers. In the subsequent process step, the dielectric layer 164 is formed from tungsten oxide. To that end, a tungsten layer is deposited by a CVD method and is converted into tungsten oxide in a subsequent oxidation process. A further method for fabricating the barrier layer 167 and the dielectric layer 164 includes the deposition of a tungsten layer with the aid of a CVD tungsten deposition method. The tungsten layer is then thermally nitrided to form the barrier layer 167. In a further thermal process, the barrier layer 167 that has been formed is oxidized, with the result that part of the barrier layer 167 is converted into the dielectric layer 164 composed of tungsten oxide. The conductive trench filling 161 is formed in the manner described in connection with FIG. 6.

A variant of the method according to the invention in which the barrier layer is formed from a conductive material will now be described with reference to FIG. 3b. After the sinking of the conductive trench filling 161, the dielectric layer 164 and the barrier layer 167 in the trench 108, a thermal oxidation is carried out. In this case, the conductive material of which the barrier layer 167 is composed is oxidized locally on its uncovered surface, thereby producing the insulating oxide region 167'. Examples of materials that may be used for the conductive barrier are tungsten nitride, titanium nitride and/or tantalum nitride, which are converted by the oxidation into tungsten oxide, titanium oxide and tantalum oxide, respectively. Since the conductive trench filling 161 also oxidizes on its surface, this oxide layer is removed through the use of buffered HF or dilute HF selectively with respect to the oxide region 167'.

Figure 9:
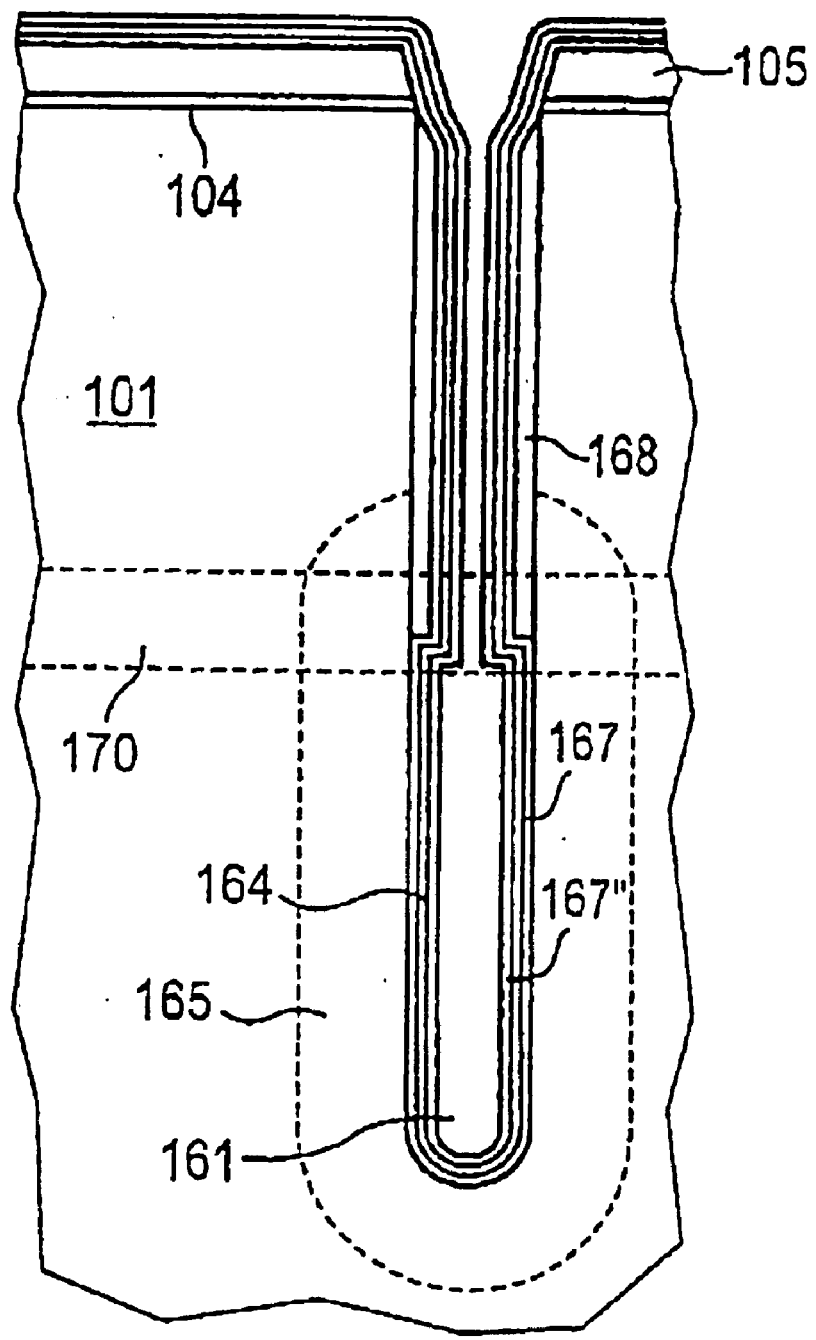

A further exemplary embodiment of the invention is illustrated in FIG. 9. In this configuration, a further barrier layer 167" is situated between the dielectric layer 164 and the conductive trench filling 161. The further barrier layer 167" forms a controlled interface between the dielectric layer 164 and the conductive trench filling 161, thereby preventing the formation of small holes (wormholes) in the interface. Furthermore, the effective dielectric constant of the trench capacitor is increased since the further barrier layer 167" is formed in a well-defined and controlled manner. In addition, the further barrier layer 167" prevents the diffusion of material and thus the mixing of conductive trench filling 161 and dielectric layer 164. The further barrier layer 167" may be formed for example from silicon nitride, silicon oxide or silicon oxynitride. Furthermore, it is also possible to use conductive materials such as tungsten nitride and/or titanium nitride for forming the further barrier layer 167".

One method for fabricating the further barrier layer 167" forms the further barrier layer after the formation of the dielectric layer 164. To that end, in a CVD process, for example, a silicon layer is deposited and reoxidized and/or renitrided. Another variant of the method provides a CVD deposition of a metal layer made of titanium, or tungsten. The metal layer is then nitrided in a nitrogen-containing atmosphere through the use of a thermal step.

We claim:

1. A trench capacitor, comprising:
   a substrate formed with a trench;
   said trench having an upper region and a lower region and a conductive trench filling formed, at least in said lower region of said trench, entirely of tungsten-containing material selected from the group consisting of tungsten-nitride, tungsten-silicide, and pure tungsten, said conductive trench filling being disposed in said upper and lower regions of said trench;
   an insulation collar formed in said upper region;
   a buried well formed in said substrate, said lower region at least partly extending through said buried well; and
   a dielectric layer formed of tungsten oxide material lining said lower and upper regions, said dielectric layer serving as a capacitor dielectric.

2. The trench capacitor according to claim 1, wherein said dielectric layer has a dielectric constant greater than 50.

3. The trench capacitor according to claim 1, including a barrier layer disposed between said dielectric layer and said substrate.

4. The trench capacitor according to claim 1, including a barrier layer disposed between said dielectric layer and said conductive trench filling.

5. The trench capacitor according to claim 1, including:
   a barrier layer disposed between said dielectric layer and said substrate; and
   a further barrier layer disposed between said dielectric layer and said conductive trench filling.

6. The trench capacitor according to claim 4, wherein said barrier layer is formed of a material selected from the group consisting of silicon oxide, silicon nitride, oxynitride, tungsten nitride, titanium nitride, and tantalum nitride.

7. The trench capacitor according to claim 1, including a vertical transistor disposed in said trench.

8. A method of producing a trench capacitor, the method which comprises:
   introducing a buried well into a substrate;
   forming a trench in the substrate, the trench having an upper region and a lower region;
   forming an insulation collar in the upper region:
   providing a capacitor dielectric by forming a dielectric layer of tungsten oxide lining the lower region; and
   filling the trench with a conductive trench filling for providing an inner capacitor electrode, the conductive trench filling being formed, at least in the lower region of the trench, of a tungsten-containing material selected from the group consisting of tungsten-nitride, tungsten-silicide, and pure tungsten.

9. The method according to claim 8, which comprises forming the dielectric layer by oxidizing a tungsten-containing layer.

10. The method according to claim 9, which comprises forming the tungsten-containing layer from a material selected from the group consisting of tungsten nitride, tungsten silicide, and pure tungsten.

11. The method according to claim 8, which comprises forming the dielectric layer by oxidizing a tungsten-containing layer at a temperature between 200° C. and 600° C. in an atmosphere containing at least one element selected from the group consisting of $O_2$, $H_2O$, $N_3O$, and NO.

12. The method according to claim 8, which comprises forming the dielectric layer by a reactive sputtering of tungsten in an oxygen-containing atmosphere.

13. The method according to claim 8, which comprises forming the dielectric layer as a layer with a dielectric constant greater than 50.

14. The method according to claim 8, which comprises subjecting the dielectric layer to a thermal treatment at a temperature between 550° C. and 1100° C. for providing the dielectric layer with a dielectric constant greater than 50.

15. The method according to claim 8, which comprises forming a tungsten-containing layer by carrying out a selective chemical vapor deposition process at a temperature between 200° C. and 400° C. and using tungsten hexafluoride as a starting material.

16. The method according to claim 8, which comprises:
   forming a tungsten-containing layer from a material selected from the group consisting of tungsten nitride, tungsten silicide, and pure tungsten; and
   producing the dielectric layer from the tungsten-containing layer.

17. A trench capacitor, comprising:
   a substrate formed with a trench;
   said trench having an upper region and a lower region and a conductive trench filling formed of tungsten-containing material disposed in said upper and lower regions of said trench;
   an insulation collar formed in said upper region and having an upper end;
   a buried well formed in said substrate, said lower region at least partly extending through said buried well;
   a dielectric layer formed of tungsten oxide material lining said lower and upper regions and having an upper end, said dielectric layer serving as a capacitor dielectric;
   a barrier layer disposed between said dielectric layer and said substrate and having an upper end, said barrier layer disposed in said upper and lower regions; and an insulation layer disposed on a top surface of said dielectric layer and extending from said upper end of said barrier layer to said upper end of said insulation collar and said dielectric layer.

18. The trench capacitor according to claim 17, wherein said barrier layer is formed of a material selected from the group consisting of silicon oxide, silicon nitride, oxynitride, tungsten nitride, titanium nitride, and tantalum nitride.

19. The trench capacitor according to claim 17, wherein said barrier layer is formed of a metal nitride material.

20. The trench capacitor according to claim 17, wherein each of said conductive trench filling, said dielectric layer, and said insulating layer has a top surface, said trench capacitor including a conductive buried bridge portion covering at least a portion of each said top surface of said conductive trench filling, said dielectric layer, and said insulating layer and connecting to a doped region of a transistor.

21. The trench capacitor according to claim 20, wherein said conductive trench filling is formed, at least in said lower region of said trench, entirely of a material selected from the group consisting of tungstenicide, nitride, tungsten-silicide, and pure tungsten.

* * * * *